United States Patent
Bowling et al.

(10) Patent No.: US 10,352,998 B2
(45) Date of Patent: Jul. 16, 2019

(54) MULTI-PROCESSOR CORE DEVICE WITH MBIST

(71) Applicant: Microchip Technology Incorporated, Chandler, AZ (US)

(72) Inventors: Stephen Bowling, Chandler, AZ (US); Igor Wojewoda, Tempe, AZ (US); Dereck Fernandes, Chandler, AZ (US); Manivannan Balu, Bangalore (IN); Yong Yuenyongsgool, Gilbert, AZ (US); Timothy Phoenix, Pepperell, MA (US); Steve Bradley, Phoenix, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 36 days.

(21) Appl. No.: 15/785,792

(22) Filed: Oct. 17, 2017

(65) Prior Publication Data
US 2019/0113568 A1    Apr. 18, 2019

(51) Int. Cl.
| | |
|---|---|
| *G01R 31/317* | (2006.01) |
| *G01R 31/3177* | (2006.01) |
| *G06F 15/80* | (2006.01) |
| *G11C 29/14* | (2006.01) |
| *G11C 29/26* | (2006.01) |
| *G11C 29/48* | (2006.01) |
| *G11C 29/04* | (2006.01) |

(52) U.S. Cl.
CPC ... *G01R 31/31724* (2013.01); *G01R 31/3177* (2013.01); *G01R 31/31723* (2013.01); *G06F 15/8061* (2013.01); *G11C 29/14* (2013.01); *G11C 29/26* (2013.01); *G11C 29/48* (2013.01); *G11C 2029/0401* (2013.01); *G11C 2029/0409* (2013.01)

(58) Field of Classification Search
CPC .......... G01R 31/31724; G01R 31/3177; G01R 31/31723
See application file for complete search history.

(56) References Cited

U.S. PATENT DOCUMENTS

| | | | |
|---|---|---|---|
| 6,163,829 A | 12/2000 | Greim et al. | 710/260 |
| 7,174,489 B2 * | 2/2007 | Sadakata | G11O 29/14 365/201 |
| 2004/0006729 A1 * | 1/2004 | Pendurkar | G01R 31/31855 714/733 |

(Continued)

OTHER PUBLICATIONS

Partial International Search Report and Invitation to Pay Additional Fees, Application No. PCT/US2018/055151, 16 pages, dated Jan 24, 2019.

(Continued)

*Primary Examiner* — Thien Nguyen
(74) *Attorney, Agent, or Firm* — Slayden Grubert Beard PLLC

(57) ABSTRACT

In an embedded device with a plurality of processor cores, each core has a static random access memory (SRAM), a memory built-in self-test (MBIST) controller associated with the SRAM, an MBIST access port coupled with the MBIST controller, an MBIST finite state machine (FSM) coupled with the MBIST access port via a first multiplexer, and a JTAG interface coupled with the MBIST access ports of each processor core via the multiplexer of each processor core.

24 Claims, 4 Drawing Sheets

(56) References Cited

U.S. PATENT DOCUMENTS

| | | | |
|---|---|---|---|
| 2004/0044491 A1* | 3/2004 | Yonaga | G01R 31/31723 702/118 |
| 2004/0128596 A1 | 7/2004 | Menon et al. | 714/724 |
| 2006/0168491 A1* | 7/2006 | Lee | G11O 29/02 714/733 |
| 2010/0017664 A1* | 1/2010 | Jang | G11O 29/16 714/719 |
| 2011/0209021 A1* | 8/2011 | Sorensen | A61B 7/00 714/733 |
| 2012/0157920 A1* | 6/2012 | Flachbart | A61M 5/142 604/151 |
| 2014/0173345 A1 | 6/2014 | Gorki et al. | 714/30 |
| 2016/0267047 A1 | 9/2016 | Kris et al. | 710/110 |

OTHER PUBLICATIONS

International Search Report and Written Opinion, Application No. PCT/US2018/055151, 18 pages, dated Apr. 23, 2019.

\* cited by examiner

REGISTER 4-23: MBISTCON – mBIST CONTROL REGISTER

| Upper Half: | | | | | | | |
|---|---|---|---|---|---|---|---|
| U-0 | U-0 | U-0 | U-0 | U-0 | U-0 | U-0 | R/W-0* |
| — | — | — | — | — | — | — | FLTINJ |
| bit 15 | | | | | | | bit 8 |

| Lower Half: | | | | | | | |
|---|---|---|---|---|---|---|---|
| R/W/HS-0* | U-0 | U-0 | R-0* | U-0 | U-0 | U-0 | R/W/HC-0* |
| MBISTDONE | — | — | MBISTSTAT | — | — | — | MBISTEN |
| bit 7 | | | | | | | bit 0 |

Reset Info:
* Reset on True POR Reset (true_por_reset_n = 0)

bit 15-9    Unimplemented: Reads as '0' bit 8    FLTINJ: MBIST Fault Inject Control bit

0 = The MBIST test will execute normally
     1 = The MBIST test will complete and set MBISTSTAT = 1, simulating a SRAM test failure.

Note: This bit is only cleared at a True POR reset bit 7    MBISTDONE: MBIST Done Status bit 0 = No MBIST operation has occurred on the last reset sequence.
     1 = A MBIST operation has been executed.

bit 6-5    Unimplemented: Reads as '0' bit 4    MBISTSTAT: MBIST Status bit

1 = The last MBIST failed
     0 = The last MBIST passed. All memory may not have been tested.

bit 3-1    Unimplemented: Reads as '0' bit 0    MBISTEN: MBIST Enable bit

0 = MBIST test is dis-armed
     1 = MBIST test is armed. A MBIST test will execute at the next device reset.

Note: This bit is only cleared at a True POR reset. It will self-clear when MBIST test is complete.

*Figure 4*

| Operating Condition | Master Data RAM Tested? | Slave Data RAM Tested? | Slave PRAM Tested? |
|---|---|---|---|
| Production MBIST Test using DFX TAP Interface in Private Test Mode | YES | YES | YES |
| True POR Reset | FPOR.BISTDIS = 0 | FSLV1POR.BISTDIS = 0 | NO |
| MCLR Reset, User Mode | Master MBISTCON.MBISTEN = 1 | Slave MBISTCON.MBISTEN = 1 | |
| MCLR Reset, Debug Mode SMCLR Disabled | Master MBISTCON.MBISTEN = 1 | Slave MBISTCON.MBISTEN = 1 | |
| MCLR Reset, Debug Mode with SMCLR Enabled | Master MBISTCON.MBISTEN = 1, AND MCLR = 0 | Slave MBISTCON.MBISTEN = 1, AND (SMCLR = 0 or MCLR = 0) | |
| Master Software Reset, WDT or DMT reset | Master MBISTCON.MBISTEN = 1 | Slave MBISTCON.MBISTEN = 1 | |
| Slave Software Reset, WDT or DMT Reset | NO | Slave MBISTCON.MBISTEN = 1 | |

*Figure 5*

MULTI-PROCESSOR CORE DEVICE WITH MBIST

TECHNICAL FIELD

The present disclosure relates to multi-processor core devices, in particular multi-processor core microcontrollers with built in self-test functionality.

BACKGROUND

A microcontroller is a system on a chip and comprises not only a central processing unit (CPU), but also memory, I/O ports, and a plurality of peripherals. A multi-processor core device, such as a multi-core microcontroller, comprises not only one CPU but two or more central processing cores. Such a device provides increased performance, improved security, and aiding software development. In embedded devices, these devices require to use a housing with a high number of pins to allow access to various peripherals.

Each processor may have its own dedicated memory. In a Harvard architecture, separate memories for program and data are provided wherein the program memory (ROM) is usually flash memory and the data memory is volatile random access memory (RAM). In multi-core microcontrollers designed by Applicant, a master and one or more slave processor cores are implemented. The slave processor usually comprises RAM for both the data and the program memory, wherein the program memory is loaded through the master core.

SUMMARY

A need exists for such multi-core devices to provide an efficient self-test functionality in particular for its integrated volatile memory.

According to an embodiment, an embedded device may comprise a plurality of processor cores, each comprising: a static random access memory (SRAM); a memory built-in self-test (MBIST) controller associated with the SRAM; an MBIST access port coupled with the MBIST controller; an MBIST finite state machine (FSM) coupled with the MBIST access port via a first multiplexer; and a JTAG interface coupled with the MBIST access ports of each processor core via the multiplexer of each processor core.

According to a further embodiment, the plurality of processor cores may consist of a master core and a slave core. According to a further embodiment, the plurality of processor cores may comprise a single master core and at least one slave core. According to a further embodiment, the slave core may comprise a slave program static random access memory (PRAM) and an associated MBIST Controller coupled with the MBIST access port. According to a further embodiment, a data output of the MBIST access port can be coupled with a data input of the BIST controller associated with the SRAM, wherein a data output of the BIST controller associated with the SRAM is coupled with a data input of the BIST controller associated with the PRAM and wherein a data output of the BIST controller associated with the PRAM is coupled with a data input of the BIST access port. According to a further embodiment, each BIST controller may be individually configurable by the associated FSM and user software to perform a memory self test after a reset of the embedded device. According to a further embodiment, a reset can be initiated by an external reset, a software reset instruction or a watchdog reset. According to a further embodiment, each processor core may comprise a clock source providing a clock to an associated FSM. According to a further embodiment, different clock sources can be selected for MBIST FSM of the plurality of processor cores. According to a further embodiment, each FSM may comprise a control register coupled with a respective processing core. According to a further embodiment, a reset sequence of a processing core can be extended until a memory test has finished. According to a further embodiment, a signal supplied from the FSM can be used to extend a reset sequence. According to a further embodiment, the embedded device may further comprise configuration fuses in the master core for configuring the master MBIST functionality and each slave MBIST functionality.

According to another embodiment, in a method for operating an embedded device comprising a plurality of processor cores, each comprising a static random access memory (SRAM), a memory built-in self test (MBIST) controller associated with the SRAM, an MBIST access port coupled with MBIST controller, an MBIST finite state machine (FSM) coupled with the MBIST access port via a first multiplexer, and a JTAG interface coupled with the MBIST access ports of each processor core via the multiplexer of each processor core, the method may comprise: configuring an MBIST functionality for at least one core wherein MBIST is controlled by an FSM of the at least one core through the multiplexer; performing a reset; and during a reset sequence or when access to the SRAM has been suspended, performing the MBIST.

According to a further embodiment of the method, the plurality of processor cores may comprise a single master core and at least one slave core. According to a further embodiment of the method, the slave core may comprise a slave program static random access memory (PRAM) and an associated MBIST Controller coupled with the MBIST access port. According to a further embodiment of the method, the method may further comprise configuring each BIST controller individually to perform a memory self test by configuring a fuse in the master core. According to a further embodiment of the method, a reset can be initiated by an external reset, a software reset instruction or a watchdog reset. According to a further embodiment of the method, the method may further comprise providing a clock to an FSM through a clock source within each processor core. According to a further embodiment of the method, the method may further comprise selecting different clock sources for an MBIST FSM of the plurality of processor cores. According to a further embodiment of the method, each FSM may comprise a control register coupled with a respective processing core. According to a further embodiment of the method, a reset sequence of a processing core can be extended until a memory test has finished. According to a further embodiment of the method, a signal fed to the FSM can be used to extend a reset sequence.

BRIEF DESCRIPTION OF THE DRAWINGS

FIG. 4 shows a possible embodiment of a control register associated with the MBIST functionality; and FIG. 5 shows a table with MBIST test conditions.

DETAILED DESCRIPTION

According to various embodiments, a flexible architecture for independent memory built-in self-test operation associated with each core can be provided while allowing programmable clocking for its memory test engines both in user mode and during production test.

Figure 1:
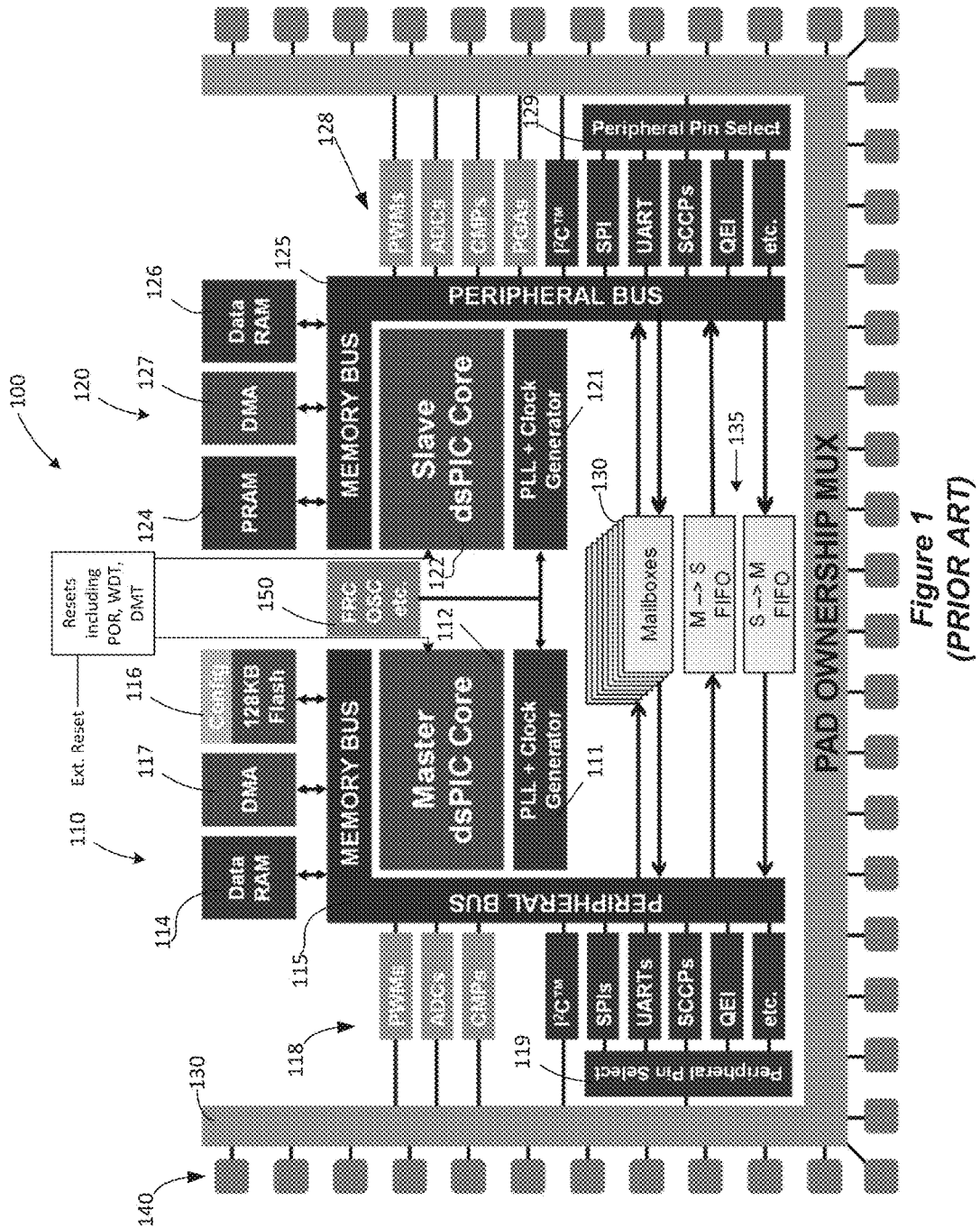
FIG. 1 shows a block diagram of a conventional dual-core microcontroller.

As shown in FIG. 1, a dual or multi core processing single chip device 100 can be designed to have a master microcontroller 110 with a master central processing unit (CPU) 112, memory and peripheral busses 115 and one or more slave units 120 (only one shown in FIG. 1) each having a slave central processing unit 122, memory and peripheral busses 125 wherein a core design of each slave central processing unit 122 may be generally identical or similar to the core design of the master CPU 112. However, according to other embodiments, the slave CPU 122 may be different from the master CPU 112. A single internal/external oscillator unit 150 can be provided that is coupled with individual PLL and clock generator units 111 and 121 for each core, respectively. The master microcontroller has its own set of peripheral devices 118 as shown in FIG. 1 and may have a peripheral pin select unit 119 that assigns certain peripheral devices 118 to selectable external pins 140. Other peripherals 118 may have fixed association that can be controlled through a pad ownership multiplexer unit 130 to allow general ownership assignment of external pins to either core 110 or 120.

The slave unit 120 may or may not have its own set of peripheral devices 128 including its own peripheral pin select unit 129 and, thus, forms a microcontroller by itself. Thus, each master device 110 and slave device 120 form more or less completely independent processing devices and may communicate with a communication interface 130, 135 that may include a mailbox system 130 and a FIFO communication interface 135. FIG. 1 shows such a design with a master microcontroller 110 and a single slave microcontroller 120. The communication interface 130, 135 allows for communication between the two cores 110, 120. Each processor 112, 122 may be designed in a Harvard architecture as shown. However, the principles according to the various embodiments may be easily translated into a von Neumann architecture. The master unit 110 comprises, e.g., flash memory 116 used as the program memory that may also include configuration registers and random access memory 114 used as data memory, each coupled with the master core 112. Each unit 110 and 1120 may have its own DMA controller 117 and 127 coupled with its memory bus 115, 125, respectively.

As shown in FIG. 1, the slave unit 120 can be designed without flash memory. Instead a dedicated program random access memory 124 is provided. The data memory is formed by data RAM 126. Due to the fact that the program memory 124 is volatile it will be loaded through the master 110 according to various embodiments. This design choice has the advantage that a bottleneck provided by flash technology is avoided. Flash memory is generally slower than RAM. Hence, there will be no read delays and the slave can be operated at a higher execution speed which may be very beneficial for certain high speed applications such as, e.g., SMPS applications. As stated above, more than one slave unit 120 may be implemented according to various embodiments. In case both cores are identical, the master core 112 can be designed to include additional instructions which may either not be implemented in the slave unit 122 or non functional in the slave unit. These additional instructions allow the transfer of data from the flash memory 116 or from an external source into the PRAM 124 of the slave device 120. For example, according to an embodiment, multiple cores may be implemented within a single chip device and each core may have an assigned configuration register, wherein one of the bits of such a register may define whether the respective unit is a master or a slave. Logic may be present that allows for only one of the cores to be set as a master. Once this bit has been set, the additional instruction may be allowed to be executed. In the other units (slaves) these instructions may not be executed, for example, they could be interpreted as illegal opcodes.

Control logic to access the PRAM 124 by the master unit 110 can be located in the master unit. Alternatively, a similar unit may be arranged within the slave unit 120. Either unit is designed to grant access of the PRAM 124 either exclusively to the master unit 110 or to the slave unit 120. Other embodiments may place some part of the logic within the master core and other parts in the salve core or arrange the logic outside both units. Similarly, communication interface 130, 13 may be inside either unit or entirely outside both units. Additional control for the PRAM access units may be provided by the communication interface 130. The embodiments are not limited to a dual core implementation as shown. A person skilled in the art will realize that other implementations are possible.

According to various embodiments, there are two approaches offered to transferring data between the Master and Slave processors. The mailbox 130 based data pipe is the default approach and always present. A FIFO based data pipe 135 can be a parameterized option. Each approach has benefits and disadvantages.

Figure 2:
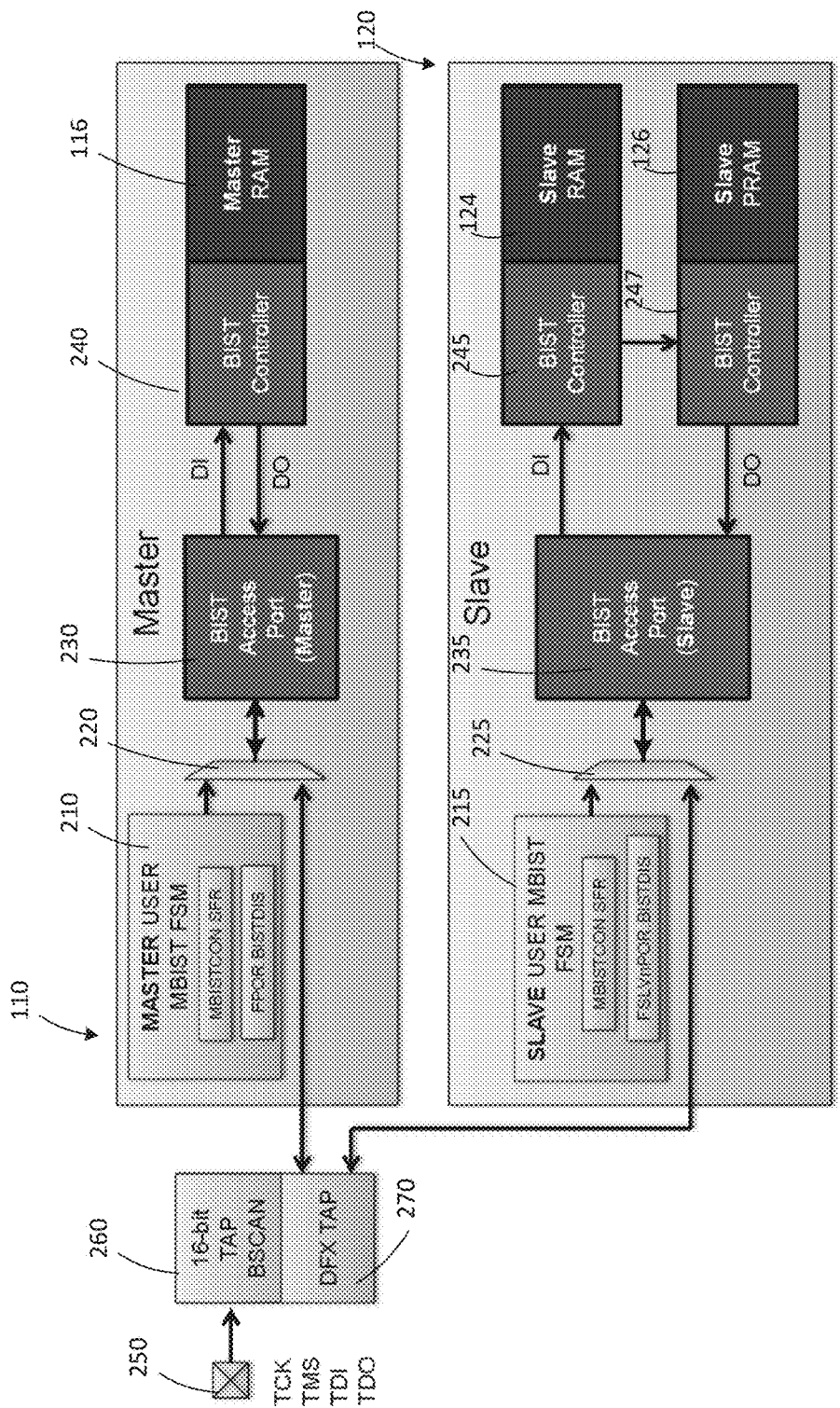
FIG. 2 shows specific parts of a dual-core microcontroller providing a BIST functionality according to various embodiments.
Figure 3:
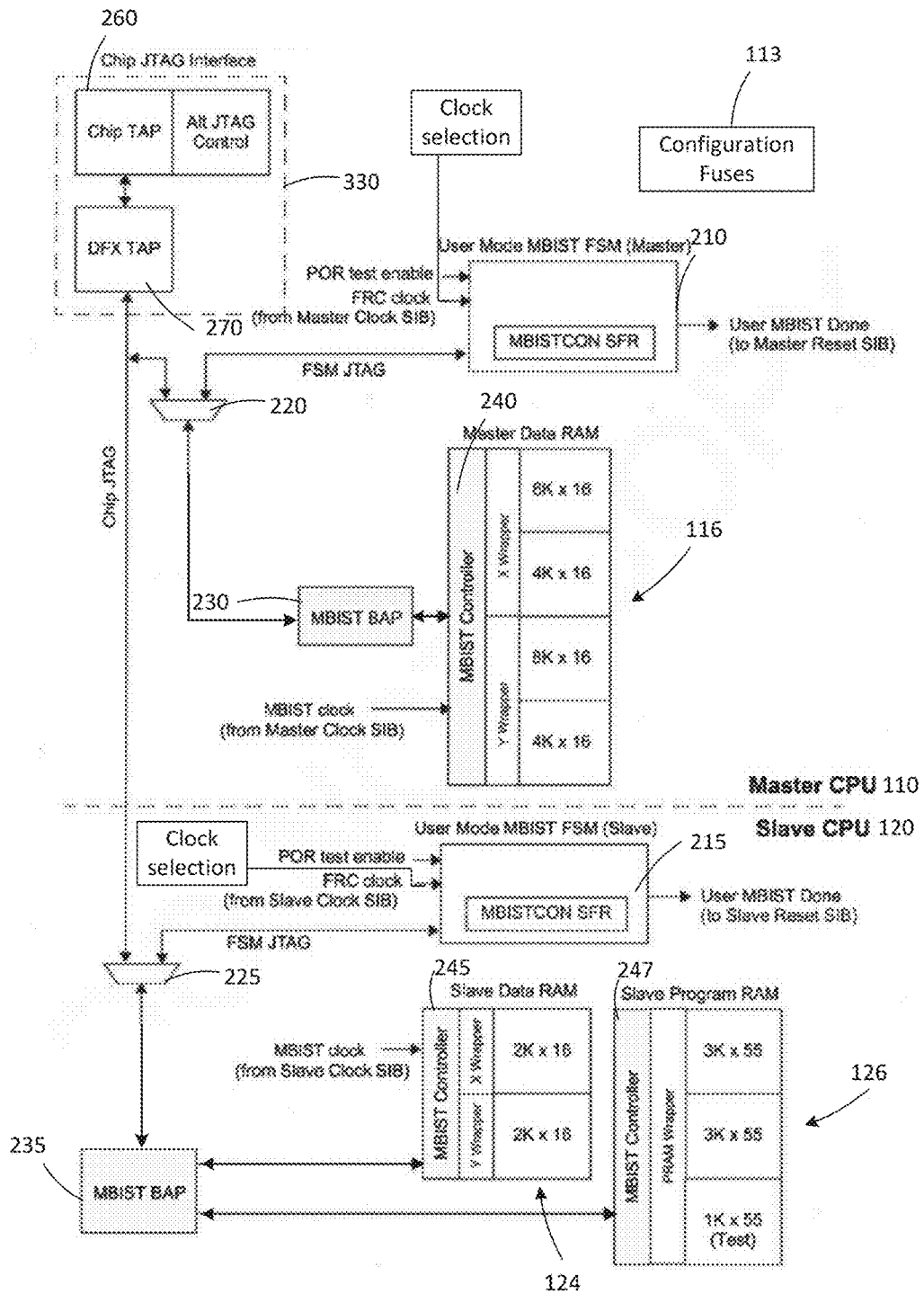
FIG. 3 shows a more detailed block diagram of the BIST circuitry as shown in FIG. 2.

According to an embodiment, a multi-core microcontroller as shown in FIG. 1 can be designed to implement a memory build-in self-test (MBIST) functionality for the static random access memory (SRAM) as will be explained in more detail below. FIGS. 2 and 3 show various embodiments of such a MBIST unit for the master and slave units 110, 120.

According to various embodiments, the SRAM has a build-in self test (BIST) capabilities, as for example provided by Mentor® Tessent® MemoryBIST (MBIST) for testing. The Mentor® solution is a design tool which automatically inserts test and control logic into the existing RTL or gate-level design. Other BIST tool providers may be used. In addition to logic insertion, such solutions also generate test patterns that control the inserted logic. A comprehensive suite of test algorithms can be executed on the device SRAMs in a short period of time. Thus, a first BIST controller 240 is associated with the master data memory 116 of the master core 110 and two separate BIST controllers 245 and 247 are provided for the slave RAM 124 and the slave PRAM 126, respectively. The master core 110 furthermore provides for a BIST access port 230 and the slave core 120 for a single BIST access port 235 that connects with both BIST controllers 245 and 247 wherein a data out port is connected with a data in port of BIST controller 245 whose data out port is connected with the data in port of BIST controller 247 whose data out port is connected with the data in port of BIST access port 235. Thus, these devices are linked in a daisy chain fashion.

According to various embodiments, a first user MBIST finite state machine 210 is provided that may connect with the BIST access port 230 of the master core 110 via a multiplexer 220. The multiplexer 220 also provides external access to the BIST access port 230 via external pins 250. A JTAG interface 260, 270 is provided between multiplexer 220 and external pins 250. Thus, the external pins may encompass a TCK, TMS, TDI, and TDO pin as known in the art. FIGS. 2 and 3 show JTAG test access port (TAP) on the device with Chip TAP 260 which allows access to standard JTAG test functions, such as getting the device ID or performing boundary scan. FIGS. 2 and 3 also shows DFX TAP 270, wherein DFX stands for 'Design For x' and comes from the term 'Design For Test' (DFT). In this case, 'x' is some special test operation. The DFX TAP 270 is a generic extension to a JTAG TAP (test access port), that adds special JTAG commands for test functions. In this case, the DFX TAP 270 can be provided to allow access to either of the BIST engines for production testing. Either the master or slave CPU BIST engine may be connected to the JTAG chain for receiving commands. Also, the DFX TAP 270 is disabled whenever Flash code protection is enabled on the device. This would prevent someone from trying to steal code from the device by (for example) analyzing contents of the RAM.

A similar circuit comprising user MBIST finite state machine 215 and multiplexer 225 is provided for the slave core 120 as shown in FIGS. 2 and 3. The multiplexer 225 is also coupled with the external pins 250 via JTAG interface 260, 270.

The MBIST functionality on this device is provided to serve two purposes according to various embodiments. First, it enables fast and comprehensive testing of the SRAM at speed during the factory production test. Secondly, the MBIST allows a SRAM test to be performed by the customer application software at run-time (user mode). This is important for safety-critical applications. The device has two different user interfaces to serve each of these needs as shown in FIGS. 2 and 3.

FIG. 4 shows an exemplary embodiment of the MBIST control register which can be implemented to control the functions of the finite state machines 210 and 215, respectively in each of the master and slave unit. This register can have certain bits, such as FLTINJ and MBISTEN used to control the state machine and other bits used to indicate a current status of the state machine, such as, e.g., MBIST-DONE indicating the end of a test and MBISTSTAT indicating failure of the memory or a passing state.

According to various embodiments, the MBIST implementation is unique on this device because of the dual (multi) CPU cores. A MBIST test is generally initiated when a device POR or MCLR event occurs which resets both CPU cores and during a reset in one CPU core or the other in debug mode via MCLR or SMCLR. The JTAG interface 330 provides a common link to all RAMs on the device for production testing, no matter which core the RAM is associated with. Each core is able to execute MBIST independently at any time while software is running. This allows the MBIST test frequency to be optimized to the application running on each core according to various embodiments.

When the MBIST is accessed via the JTAG interface, the chip is in a test mode with all of the CPU and peripheral logic in a disabled state. This allows the JTAG interface to access the RAMs directly through the DFX TAP. All data and program RAMs can be tested, no matter which core the RAM is associated with.

When the chip is running user software (chip not in a test mode), then each core could execute MBIST independently using the MBISTCON SFR interface. Only the data RAMs associated with that core are tested in this case. The device according to various embodiments has a total of three RAMs:

Master CPU data RAM (X and Y RAM combined)
Slave CPU data RAM (X and Y RAM combined)
Slave CPU Program RAM (PRAM)

One or more of these RAMs may be tested during a MBIST test depending on the operating conditions listed in FIG. 5 which specifically describes each operating conditions and the conditions under which each RAM is tested.

Since MBIST is tool-inserted, it automatically instantiates a collar around each SRAM. Also, not shown is its ability to override the SRAM enables and clock gates. Since the instanced logic can add significant delay to any of the SRAM bank's input paths, static timing must be checked to verify it is not creating a critical path (for the design). If it does, hand manipulation of the BIST collar may be necessary.

The insertion tools generate the test engine, SRAM interface collar, and SRAM test patterns. Communication with the test engine is provided by an IJTAG interface (IEEE P1687). IJTAG is a protocol that operates on top of a standard JTAG interface and, among other functions, provides information on the connectivity of TDRs and TAPs in the device.

For production testing, a DFX TAP is instantiated to provide access to the Tessent® IJTAG interface. The DFX TAP is accessed via the SELECTALT, ALTJTAG and ALTRESET instructions available in the main device chip TAP. These instructions are made available in private test modes only.

The user-mode user interface has one special function register (SFR), MBISTCON, and one Flash configuration fuse within a configuration fuse unit 113, BISTDIS, to control operation of the test. The user interface controls a custom state machine that takes control of the Tessent® IJTAG interface. The custom state machine provides the right sequence of IJTAG commands to request a clock source, run the test and return the results of the test.

When the MBIST has been activated via the user interface, the MBIST is executed as part of the device reset sequence. The MBIST is run after the device configuration and calibration fuses have been loaded, but before the device is allowed to execute code.

The user interface allows MBIST to be executed during a POR/BOR reset, or other types of resets.

The BISTDIS configuration fuse in configuration fuse unit 113 allows the user to select whether MBIST runs on a POR/BOR reset. When BISTDIS=1 (default erased condition) MBIST will not run on a POR/BOR reset.

Each CPU core 110, 120 may have its own configuration fuse to control the operation of MBIST at a device POR. The BISTDIS configuration fuse is located in the FPOR register for the Master CPU 110 and in the FSLVnPOR register for each Slave CPU(s) 120 according to an embodiment. According to one embodiment, all fuses controlling the operation of MBIST for all cores are located in the master core in block 113 as shown in FIG. 3. The reason for this implementation is that there may be only one Flash panel on the device which is associated with the master CPU. However, such a Flash panel may contain configuration values that control both master and slave CPU options.

The MBISTCON SFR as shown in FIG. 4 for each core is coupled the respective core. Thus, each core has a separate MBIST state machine 210, 215 with a respective MBISTCON special function register to allow fully independent software control. It can be write protected according to some embodiments to avoid accidental activation of a MBIST test according to an embodiment. The user must write the correct write unlock sequence to the NVMKEY register of the Flash controller macro to enable a write to the MBISTCON SFR. Writes are allowed for one instruction cycle after the unlock sequence. If multiple bits in the MBISTCON SFR need to be written separately, a new unlock sequence will be required for each write. The control register for a slave core may have additional bits for the PRAM.

According to one embodiment, the MBIST for user mode testing is configured to execute the SMarchCHKBvcd test algorithm according to an embodiment. The algorithm takes 43 clock cycles per RAM location to complete. Other algorithms may be implemented according to various embodiments.

A variation of this algorithm, SMarchCHKB, is available which completes faster than the SMarchCHKBvcd algorithm by using fast row or fast column sequences. This algorithm works by holding the column address constant until all row accesses complete or vice versa.

The user mode MBIST algorithm is the same as the production test algorithm according to an embodiment. The user mode tests can only be used to detect a failure according to some embodiments. It may not be not possible in some implementations to determine which SRAM locations caused the failure.

Although it is possible to provide an optimized algorithm specifically for SRAM scrubbing, none may be provided on this device according to an embodiment.

According to some embodiments, the user mode MBIST test will request the FRC+PLL clock source from the respective core and configure it to run the test. Since the MBIST test runs as part of the reset sequence according to some embodiments, the clock source must be available in reset.

The MBIST test consumes 43 clock cycles per 16-bit RAM location according to an embodiment. Therefore, the MBIST test time for a 48 KB RAM is 43×24,576=1,056,768 clock cycles. The MBIST clock frequency should be chosen to provide a reasonably short test time and provide proper operation of the test at all device operating conditions. The choice of clock frequency is left to the discretion of the designer. However, a test time of 20 msec or less is recommended in order to prevent an extended device reset sequence when the test runs. Based on this requirement, the MBIST clock should not be less than 50 MHz.

The preferred clock selection for the user mode MBIST test is the user's system clock selected by the device configuration fuses. This allows the user mode MBIST test speed to match the startup speed of the user's application, allowing the test to be optimized for both environmental operating conditions and device startup power.

The MBIST engine on this device checks the entire range of a SRAM 116, 124 when executed according to an embodiment. Any SRAM contents will effectively be destroyed when the test is run. User application variables will be lost and the system stack pointer will no longer be valid for returns from calls or interrupt functions. Therefore, the user mode MBIST test is executed as part of the device reset sequence.

An alternative to placing the MBIST test in the reset sequence is to stall any attempted SRAM accesses by the CPU or other masters while the test runs. Since all RAM contents are destroyed during the test, the user software would need to disable interrupts and DMA while the test runs and re-initialize the device SRAM once the test is complete. No function calls or interrupts should be taken until a re-initialization is performed. This approach has the benefit that the device I/O pins can remain in an initialized state while the test runs. According to some embodiments, the device reset sequence is extended while the MBIST runs with the I/O in an uninitialized state. An alternative approach could may be considered for other embodiments.

When a MBIST test is executed, the application software should check the MBIST status before any application variables in SRAM are initialized according to some embodiments. Furthermore, no function calls should be made and interrupts should be disabled. Failure to check MBIST status prior to these events could cause unexpected operation if the MBIST engine had detected a failure.

All user mode MBIST tests are disabled when the configuration fuse BISTDIS=1 and MBISTCON.MBISTEN=0.

If a MBIST test is desired at power-up, the BISTDIS device configuration fuse should be programmed to 0. Each CPU core 110, 120 has its own BISTDIS configuration fuse associated with the power-up MBIST. Each fuse must be programmed to 0 for the MBIST to check the SRAM associated with the CPU core 110, 120. User software may detect the POR reset by reading the RCON SFR at startup, then confirming the state of the MBISTDONE and MBISTSTAT status bits. If MBISTSTAT=1, then the startup software may take the appropriate actions to put the device into a safe state without relying on the device SRAM.

A MBIST test may be initiated in software as follows according to an embodiment:

Write the unlock sequence to the NVMKEY SFR
Write the value 0x0001 to MBISTCON SFR
Reset the device using the RESET instruction Upon exit from the reset sequence, the application software should check the state of the MBISTDONE bit and MBISTSTAT. The RCON SFR can also be checked to confirm that a software reset occurred. If MBISTSTAT=1, then the startup software may take the appropriate actions to put the device into a safe state without relying on the device SRAM.

Each CPU core 110, 120 has a MBISTCON SFR as shown in FIG. 4 which is used to test the data SRAM 116, 124, 126 associated with that core. Since the MBISTCON.MBISTEN bit is only reset on a POR event, a MBIST test may also run on other forms of soft reset if MBISTEN is set in software. These resets include a MCLR reset and WDT or DMT resets. WDT and DMT stand for WatchDog Timer or Dead-Man Timer, respectively. Both timers are provided as safety functions to prevent runaway software. The WDT must be cleared periodically and within a certain time period. Otherwise, the software is considered to be lost or hung and the device is reset. The same is true for the DMT, except that a more elaborate software interaction is required to avoid a device reset. User software must perform a specific series of operations to the DMT within certain time intervals. The DMT generally provides for more details of identifying incorrect software operation than the WDT.

The MBISTCON SFR contains the FLTINJ bit, which allows user software to simulate a MBIST failure. This feature allows the user to fully test fault handling software.

A simulated MBIST failure is invoked as follows:

Write the unlock sequence to the NVMKEY SFR
Write the MBISTCON SFR to 0x0101.
Reset the device using the RESET instruction Upon exit from the reset sequence, the application software should observe that MBISTDONE=1, MBISTSTAT=1, and FLTINJ=1. This lets the user software know that a failure occurred and it was 'simulated'. The FLTINJ bit is reset only on a POR to allow the user to detect the simulated failure condition.

The user mode MBIST test is run as part of the device reset sequence. If FPOR.BISTDIS=O and a POR occurs, the MBIST test will run to completion, regardless of the MCLR pin status. If another POR event occurs, a new reset sequence and MBIST test would occur.

It is possible that a user mode MBIST, initiated via the MBISTCON SFR, could be interrupted as a result of a POR event (power failure) during the device reset sequence. If FPOR.BISTDIS=1, then a new BIST would not be started. The application software can detect this state by monitoring the RCON SFR.

A more detailed block diagram of the MBIST system of FIG. 2 on the device according to various embodiments is shown in FIG. 3. This diagram is provided to show conceptual interaction between the automatically inserted IP, custom IP, and the two CPU cores 110, 120.

The inserted circuits for the MBIST functionality consists of three types of blocks. Each RAM to be tested has a Controller block 240, 245, and 247 that generates RAM addresses and the RAM data pattern. The Controller blocks 240, 245, and 247 compare the data read from the RAM to check for errors.

The Controller blocks 240, 245, and 247 are controlled by the respective BIST access ports (BAP) 230 and 235. The specifics and design of each BIST access port may depend on the respective tool that provides for the implementation, such as for example, the Mentor® Tessent® MBIST. The BAP 230, 235 decodes the commands provided over the IJTAG interface and determines the tests to be run. The BAP may control more than one Controller block, allowing multiple RAMs to be tested from a common control interface.

The structure shown in FIG. 3 allows the RAMs 116, 124, and 126 associated with the Master and Slave CPUs 110, 120 to be tested together, or individually, depending on whether the device is in a production test mode or in user mode. Furthermore, the program RAM (PRAM) 126 associated with the Slave CPU 120 may be excluded from the MBIST test depending on the operating mode.

The MBIST system has multiplexers 220, 225 that allow the MBIST test to be run independently on the RAMs 116, 124, 126 associated with each CPU. Or, all device RAMs 116, 124, and 126 can be linked together for testing via the chip JTAG interface 330 and DFX TAP 270.

In a production MBIST test scenario, the JTAG multiplexers 220, 225 link together the MBIST BAP 230, 235 of each CPU core 110, 120. This allows both MBIST BAP blocks 230, 235 to be controlled via the common JTAG connection.

The Master and Slave CPUs each have a custom FSM (finite state machine) 210, 215 that is used to activate the MBIST test in a user mode. The JTAG multiplexers 220, 225 allow each MBIST BAP 230, 235 to be isolated from the JTAG chain and controlled by the local FSM 210, 215. The primary purpose of each FSM 210, 215 is to generate a set of pre-determined JTAG commands based on user software interaction with the MBISTCON register. This allows the user software, for example, to invoke an MBIST test. In a normal production environment, MBIST would be controlled using an external JTAG connection and more comprehensive testing can be done based on the commands sent over the JTAG interface.

The multiplexers 220 and 225 are switched as a function of device test modes. A pair of device pins may be used to allow a special test entry code to be clocked into the device while it is held in reset. In particular, the device can have a test mode that is used for scan testing of all the internal device logic. The external JTAG interface is used to control the MBIST tests while the device is in the scan test mode. A pre-determined set of test patterns can be applied to the JTAG pins during production testing to activate the MBIST on the various RAM panels. The CPU and all other internal device logic are effectively disabled during this test mode due to the scan testing according to various embodiments. In user mode and all other test modes, the MBIST may be activated in software using the MBISTCON SFR.

The MBIST system associated with each CPU can request independent clock sources for the purpose of operating the FSM 210, 215 and the MBIST Controller blocks 240, 245, 247.

The MBIST system has multiple clock domains, which must be managed with appropriate clock domain crossing logic according to various embodiments. The first is the JTAG clock domain, TCK. The second clock domain is the FRC clock, which is used to operate the User MBIST FSM 210, 215. The User MBIST FSM 210, 215 also has connections to the CPU clock domain to facilitate reads and writes of the MBISTCON SFR. The final clock domain is the clock source used to operate the MBIST Controller block 240, 245, 247. This is a source faster than the FRC clock which minimizes the actual MBIST test time.

Since the Master and Slave CPUs 110, 120 each have their own clock systems, the clock sources used to run the MBIST tests on the Master and Slave RAMs 116, 124, 126 need to be independent of each other. The clock sources for Master and Slave MBIST will be provided by respective clock sources associated with each CPU core 110, 120.

Each User MBIST FSM 210, 215 has a 'done' signal which is connected to the device Reset SIB. This signal is used to delay the device reset sequence until the MBIST test has completed. The reset sequence can be extended by ANDing the MBIST done signal with the nvm_mem_ready signal that is connected to the Reset SIB. Therefore, device execution will be held off until the configuration fuses have been loaded and the MBIST test has completed.

On a dual core device, there is a secondary Reset SIB for the Slave core. The Slave Reset SIB handles local Slave core resets such as WOT events, software reset instruction, and the SMCLR pin (when debugging).

Since the Slave core is dependent on configuration fuses held in the Master core Flash according to an embodiment, the Slave core Reset SIB receives the nvm_mem_rdy signal from the Master core Flash panel. Slave core execution may be held off by ANDing the MBIST done signal from the Slave User MBIST FSM with the nvm_mem_rdy signal connected to the Slave Reset SIB.

In most cases, a Slave core 120 will have less RAM 124/126 to be tested than the Master core. In the event that the Master core is reset or a POR occurs that causes both the Master and Slave core to run a MBIST test, the Slave MBIST should be complete before the Slave core is enabled via the Master/Slave interface (MSI). Therefore, the Slave MBIST execution is transparent in this case. If the Slave core MBIST is not complete when the MSI enables the Slave core, then the Slave core execution will be delayed until the MBIST completes.

Except for specific debugging scenarios, the Slave core will be reset whenever the Master core is reset. Therefore, a Slave MBIST test will run if the slave MBISTEN bit is set, or a POR occurred and the FSLVnPOR.BISTDIS bit is programmed to 0.

According to some embodiments, it is not possible for the Slave core 120 to check for data SRAM errors at run-time unless it is loaded with the appropriate software to check the MBISTCON SFR. Once loaded with the appropriate code and enabled via the MSI, the Slave core can execute run-time MBIST checks independent of the Master core 110 using the SWRST instruction. Or, the Slave core can simply check the results of a MBIST test whenever a POR occurs or the Master core 110 is reset.

The invention claimed is:

1. An embedded device comprising:
   a plurality of processor cores, each processor core comprising:
      a static random access memory (SRAM);
      a memory built-in self-test (MBIST) controller associated with the SRAM;
      an MBIST access port coupled with the MBIST controller; and
      an MBIST finite state machine (FSM) coupled with the MBIST access port via a first multiplexer;
   and
   a JTAG interface coupled with the MBIST access ports of each processor core via the first multiplexer of each processor core,
   wherein each BIST controller is individually configurable through the associated FSM and user software to perform a memory self test after a reset of the embedded device.

2. The embedded device according to claim 1, wherein the plurality of processor cores consists of a master core and a slave core.

3. The embedded device according to claim 1, wherein the plurality of processor cores comprises a single master core and at least one slave core.

4. The embedded device according to claim 3, wherein the slave core comprises a slave program static random access memory (PRAM) and an associated MBIST Controller coupled with the MBIST access port.

5. The embedded device according to claim 4, wherein a data output of the MBIST access port is coupled with a data input of the BIST controller associated with the SRAM, wherein a data output of the BIST controller associated with the SRAM is coupled with a data input of the BIST controller associated with the PRAM and wherein a data output of the BIST controller associated with the PRAM is coupled with a data input of the BIST access port.

6. The embedded device according to claim 1, wherein a reset is initiated by an external reset, a software reset instruction or a watchdog reset.

7. The embedded device according to claim 1, wherein each processor core comprises a clock source providing a clock to an associated FSM.

8. The embedded device according to claim 7, wherein different clock sources are selected for MBIST FSM of the plurality of processor cores.

9. The embedded device according to claim 3, wherein each FSM comprises a control register coupled with a respective processing core.

10. The embedded device according to claim 3, wherein a reset sequence of a processing core is extended until a memory test has finished.

11. The embedded device according to claim 10, wherein a signal supplied from the FSM is used to control extension of the reset sequence.

12. The embedded device according to claim 3, further comprising configuration fuses in the master core for configuring the master MBIST functionality and each slave MBIST functionality.

13. A method for operating an embedded device comprising a plurality of processor cores, each processor core comprising a static random access memory (SRAM), a memory built-in self test (MBIST) controller associated with the SRAM, an MBIST access port coupled with MBIST controller, and an MBIST finite state machine (FSM) coupled with the MBIST access port via a first multiplexer, the embedded device further comprising a JTAG interface coupled with the MBIST access port of each processor core via the first multiplexer of each processor core, the method comprising:
   configuring an MBIST functionality for each processor core separately wherein MBIST is controlled by an FSM of each processor core through the first multiplexer;
   performing a reset of at least one of the processor cores; and
   during a reset sequence, performing the MIST for the reset processor core.

14. The method according to claim 13, further comprising providing the plurality of processor cores by a single master core and at least one slave core.

15. The method according to claim 14, further comprising providing the slave core with a slave program static random access memory (PRAM) and an associated MBIST Controller coupled with the MBIST access port.

16. The method according to claim 14, further comprising configuring each BIST controller individually to perform a memory self test by configuring a fuse in the master core.

17. The method according to claim 13, wherein a reset is initiated by an external reset, a software reset instruction or a watchdog reset.

18. The method according to claim 13, further comprising providing a clock to an FSM through a clock source within each processor core.

19. The method according to claim 18, further comprising selecting different clock sources for an MBIST FSM of the plurality of processor cores.

20. The method according to claim 14, wherein each FSM comprises a control register coupled with a respective processing core.

21. The method according to claim 14, wherein a reset sequence of a processing core is extended until a memory test has finished.

22. The method according to claim 21, wherein a signal fed to the FSM is used to control extension of the reset sequence.

23. The method according to claim 13, further comprising initiating the MBIST during operation of the embedded device by stalling access to an SRAM by an associated processor core and performing the MBIST on the SRAM.

24. A method for operating an embedded device comprising a plurality of processor cores, each processor core comprising a static random access memory (SRAM), a memory built-in self test (MBIST) controller associated with the SRAM, an MBIST access port coupled with MBIST controller, and an MBIST finite state machine (FSM) coupled with the MBIST access port via a first multiplexer, the embedded device further comprising a JTAG interface coupled with the MBIST access port of each processor core via the first multiplexer of each processor core, the method comprising:
   operating the embedded device;
   configuring an MBIST functionality for an SRAM of at least one core wherein MBIST is controlled by an FSM of the at least one core through the multiplexer;
   stalling processor access to the SRAM; and
   performing the MBIST for SRAM.

* * * * *